(12) United States Patent
Nawa

(10) Patent No.: US 10,574,168 B2
(45) Date of Patent: Feb. 25, 2020

(54) ELECTRICAL MOTOR DEVICE

(71) Applicant: KABUSHIKI KAISHA TOYOTA JIDOSHOKKI, Kariya-shi, Aichi-ken (JP)

(72) Inventor: Masamichi Nawa, Kariya (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 0 days.

(21) Appl. No.: 16/090,982

(22) PCT Filed: Mar. 31, 2017

(86) PCT No.: PCT/JP2017/013682
§ 371 (c)(1),
(2) Date: Oct. 3, 2018

(87) PCT Pub. No.: WO2017/175681
PCT Pub. Date: Oct. 12, 2017

(65) Prior Publication Data
US 2019/0115863 A1    Apr. 18, 2019

(30) Foreign Application Priority Data

Apr. 7, 2016  (JP) .................... 2016-077294

(51) Int. Cl.
*H02P 27/08* (2006.01)
*H02M 7/5395* (2006.01)
(Continued)

(52) U.S. Cl.
CPC .......... *H02P 27/08* (2013.01); *H02M 3/1582* (2013.01); *H02M 7/48* (2013.01); *H02M 7/5387* (2013.01);
(Continued)

(58) Field of Classification Search
CPC ...... H02M 7/48; H02M 27/06; H02M 3/1582; H02P 27/08; H02P 21/22; G01R 19/16542; G01R 31/36
See application file for complete search history.

(56) References Cited

U.S. PATENT DOCUMENTS 7,816,805 B2  10/2010  Tanaka et al.
9,130,482 B2  9/2015  Zhao et al.
(Continued)

FOREIGN PATENT DOCUMENTS

JP   2009-118633 A   5/2009
JP   2009-131057 A   6/2009
(Continued)

OTHER PUBLICATIONS

International Preliminary Report on Patentability with the translation of Written Opinion dated Oct. 9, 2018 issued by the International Bureau in PCT/JP2017/013682.
(Continued)

*Primary Examiner* — Eduardo Colon Santana
*Assistant Examiner* — Said Bouziane
(74) *Attorney, Agent, or Firm* — Sughrue Mion, PLLC

(57) ABSTRACT

An electrical motor device according to the present invention is provided with a control unit. The control unit is configured to adjust the ratio of transformation by adjusting the ratio between a first time period, in which all upper-arm-side switching elements are on and all lower-arm-side switching element are off, and a second time period, in which all upper-arm-side switching elements are off and all lower-arm-side switching elements are on, and to select one of a plurality of driving modes for each control cycle. The plurality of driving modes include: a dual-driving mode including the first time period and the second time period in one control cycle during electrical motor driving; and an
(Continued)

electrical motor driving mode not including the first time period and the second time period in one control cycle during electrical motor driving.

4 Claims, 6 Drawing Sheets

(51) Int. Cl.
    *H02P 27/06*     (2006.01)
    *H02M 7/48*     (2007.01)
    *H02M 7/5387*     (2007.01)
    *H02M 3/158*     (2006.01)
    *H02P 27/12*     (2006.01)
    *H02P 21/22*     (2016.01)
    *H02M 1/00*     (2006.01)
    *G01R 19/165*     (2006.01)

(52) U.S. Cl.
    CPC .......... *H02M 7/5395* (2013.01); *H02P 21/22* (2016.02); *H02P 27/06* (2013.01); *H02P 27/12* (2013.01); *G01R 19/16542* (2013.01); *H02M 7/53873* (2013.01); *H02M 2001/0064* (2013.01); *H02M 2007/53876* (2013.01); *H02P 2209/01* (2013.01); *H02P 2209/13* (2013.01)

(56) References Cited

U.S. PATENT DOCUMENTS

| | | | |
|---|---|---|---|
| 9,479,084 B2 | 10/2016 | Zhao et al. | |
| 2002/0070715 A1* | 6/2002 | Sasaki | B60L 50/16 322/28 |
| 2018/0118051 A1* | 5/2018 | Linn; Jae Sang | H02P 27/08 |

FOREIGN PATENT DOCUMENTS

| | | |
|---|---|---|
| JP | 2011-051545 A | 3/2011 |
| JP | 2014-161215 A | 9/2014 |

OTHER PUBLICATIONS

International Search Report for PCT/JP2017/013682 dated Jun. 20, 2017 [PCT/ISA/210].

* cited by examiner

ELECTRICAL MOTOR DEVICE

CROSS REFERENCE TO RELATED APPLICATIONS

This application is a National Stage of International Application No. PCT/JP2017/013682 filed Mar. 31, 2017, claiming priority based on Japanese Patent Application No. 2016-077294 filed Apr. 7, 2016.

TECHNICAL FIELD

The present invention relates to a motor apparatus.

BACKGROUND ART

In a motor apparatus, when supplying a motor with alternating current transformed by an inverter from direct current generated by a direct current power supply, there is a technique that transforms the voltage of the direct current with a transformer circuit located in a stage preceding the inverter. The transformer circuit includes switches and inductors. Such a system requires switches and inductors that are highly costly and large in size. Patent document 1 discloses a motor apparatus that includes a battery connected to a neutral point of stator coils and performs step-up control. The motor apparatus opens the switch located between the battery and the neutral point when there is an abnormality.

PRIOR ART LITERATURE

Patent Literature

Patent Document 1: Japanese Laid-Open Patent Publication No. 2009-118633

SUMMARY OF THE INVENTION

Problem to be Solved by the Invention

When the motor is being driven, there may be cases in which there is a need to perform voltage transformation and there may be cases in which there is a need to perform only motor driving. Further, in the technique disclosed in patent document 1, there is a need to open the switch when there is an abnormality.

One object of the present invention is to provide a motor apparatus that easily allows for motor driving to be performed together with transformation driving, which is performed between two batteries, and only motor driving to be performed.

Means for Solving the Problem

A motor apparatus that achieves the above object includes a motor, an inverter circuit, a first power supply, a second power supply, and a control unit. The motor is configured to be driven by multiphase alternating current power. The inverter circuit includes a positive bus bar and a negative bus bar and is configured to supply multiphase alternating current power to the motor. Further, the inverter circuit includes upper arm switching elements that are respectively connected in series to lower arm switching elements to configure a plurality of switching element pairs. The first power supply is connected to the positive bus bar and the negative bus bar. The second power supply is connected to the negative bus bar and a neutral point of the motor. The control unit is configured to have the motor output a target torque and control the switching element pairs of the inverter circuit in each control cycle to transform a voltage of the second power supply in order to charge the first power supply or to transform a voltage of the first power supply in order to charge the second power supply. Further, the control unit is configured to adjust a ratio of a first period during which the upper arm switching elements are all turned on and lower arm switching elements are all turned off and a second period during which upper arm switching elements are all turned off and lower arm switching elements are all turned on to adjust a transformation ratio of the second power supply to the first power supply or a transformation ratio of the first power supply to the second power supply, and select one of a plurality of drive modes in each control cycle. The drive modes include a dual drive mode, which includes the first period and the second period in the same control cycle when the motor is being driven to perform motor driving and transformation driving, and a motor drive mode, which does not include the first period and the second period in the same control cycle when the motor is being driven to perform only motor driving.

EMBODIMENTS OF THE INVENTION

The present invention in accordance with one embodiment will now be described in detail with reference to the drawings.

Figure 1:
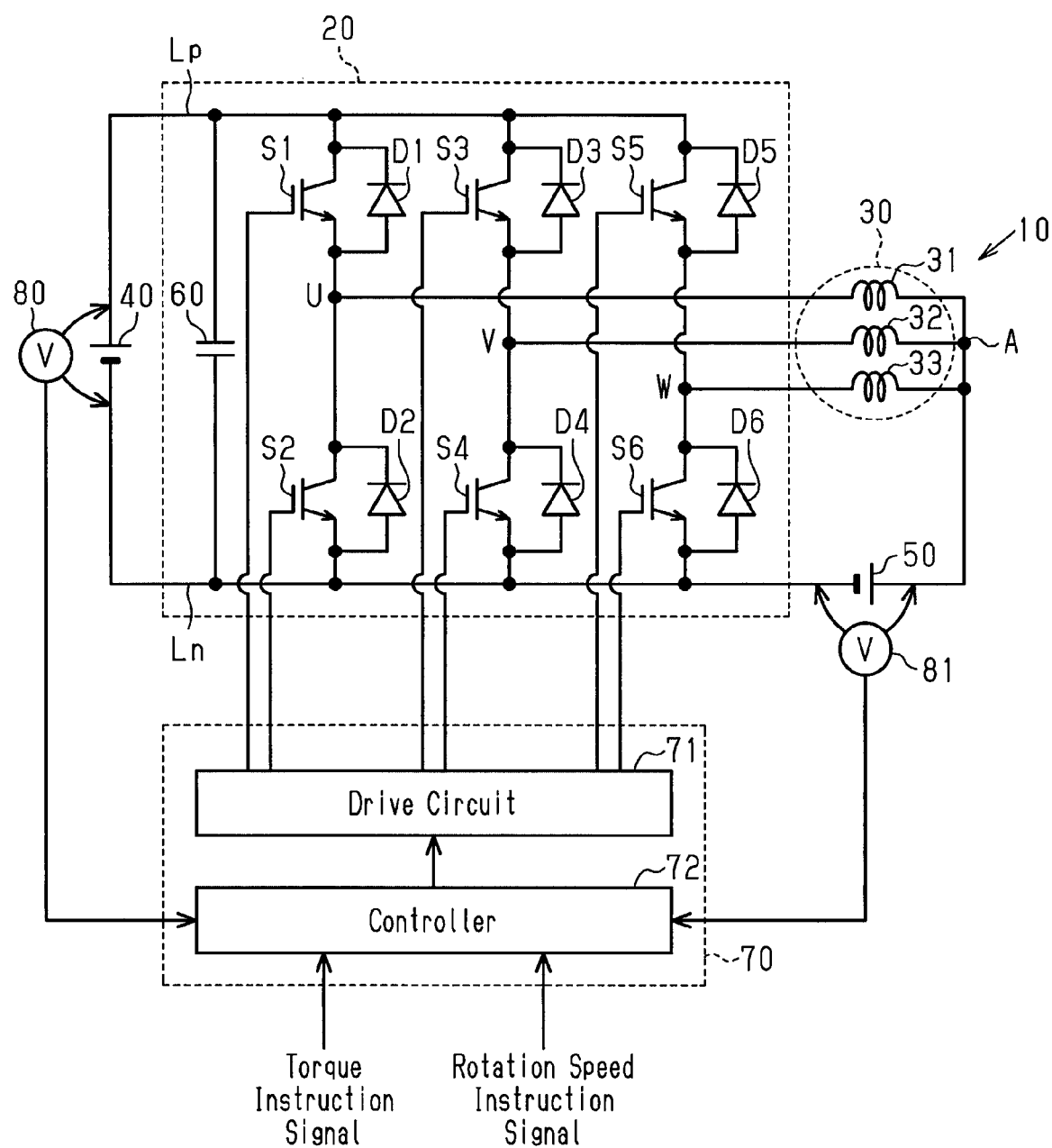
FIG. 1 is an electric diagram showing the configuration of a motor apparatus in accordance with one embodiment.

A motor apparatus 10 shown in FIG. 1 is mounted on a vehicle. The motor apparatus 10 includes an inverter circuit 20, a motor 30, a first power supply 40, a second power supply 50, a control unit 70, and voltage sensors 80 and 81.

The first power supply 40 is a direct current power supply, for example, a 48-volt on-board battery. The first power supply 40 is connected to a positive bus bar Lp and a negative bus bar Ln of the inverter circuit 20. More specifically, a positive electrode of the first power supply 40 is connected to the positive bus bar Lp and a negative electrode of the first power supply 40 is connected to the negative bus bar Ln.

The motor 30 is a three-phase motor that is rotated by three-phase alternating current power, which is multiphase alternating current power. The motor 30 includes three stator coils 31, 32, and 33 that are in a star connection. The motor 30 includes a neutral point A.

The inverter circuit 20 is configured to supply the motor 30 with three phase alternating current, which is a multiphase alternating current. The inverter circuit 20 includes switching elements S1 and S2, which configure U-phase upper and lower arms, switching elements S3 and S4, which configure V-phase upper and lower arms, and switching elements S5 and S6, which configure W-phase upper and lower arms. IGBTs are used as the switching elements S1 to S6. Diodes (D1 to D6) are connected in anti-parallel to the switching elements S1 to S6. Between the positive bus bar Lp and the negative bus bar Ln, the switching elements S1 and S2 are connected in series, the switching elements S3 and S4 are connected in series and the switching elements S5 and S6 are connected in series. The coil 31 of the three-phase motor 30 includes an end that is connected to a location between the switching elements S1 and S2. The coil 32 of the three-phase motor 30 includes an end that is connected to a location between the switching elements S3 and S4. The coil 33 of the three-phase motor 30 includes an end that is connected to a location between the switching elements S5 and S6.

Accordingly, the inverter circuit 20 includes the upper arm switching elements S1, S3, and S5, respectively connected in series to the lower arm switching elements S2, S4, and S6 to configure a plurality of (specifically, three) switching element pairs. Further, the positive bus bar Lp and the negative bus bar Ln are connected by a capacitor 60 that is located closer to the first power supply 40 than the switching elements S1 to S6.

The second power supply 50 is a direct current power supply, for example, a 12-volt on-board battery. Thus, the first power supply 40 is a high voltage battery having a higher voltage compared to the second power supply 50. The second power supply 50 is connected to the negative bus bar Ln of the inverter circuit 20 and the neutral point A of the motor 30. More specifically, a positive electrode of the second power supply 50 is connected to the neutral point A of the motor 30, and a negative electrode of the second power supply 50 is connected to the negative bus bar Ln.

The control unit 70 includes a drive circuit 71 and a controller 72. The drive circuit 71 is connected to a gate terminal of each of the switching elements S1 to S6. The controller 72 may be, for example, a control circuit, specifically, one or more exclusive hardware circuits such as ASICs, one or more processors that run on a computer program (software), or a combination of the above. A processor includes a CPU and a memory such as a RAM and a ROM. The memory stores program codes or commands that are configured to have the CPU execute processes. The memory, which is a computer readable medium, may be any available medium that is accessible by a versatile or a dedicated computer. The controller 72 turns each of the switching elements S1 to S6 on and off with the drive circuit 71. More specifically, the switching elements S1, S2, S3, S4, S5, and S6 undergo switching operations to transform the direct current generated by the first power supply 40 to alternating current that is supplied to the three-phase motor 30, which is a multiphase motor and in which the coils 31, 32, and 33 are in a star connection. That is, an inverter (inverter circuit 20, control unit 70, or the like) performs space vector PWM control. The controller 72 is configured to input torque instruction signals and rotation speed instruction signals in order to obtain a torque instruction value (or torque estimation value) and a rotation speed instruction value (or rotation speed estimation value). Further, the controller 72 is connected to voltage sensors 80 and 81. The voltage sensor 80 detects the inter-terminal voltage of the first power supply 40. The voltage sensor 81 detects the inter-terminal voltage of the second power supply 50. The controller 72 receives signals from the voltage sensors 80 and 81 to obtain the inter-terminal voltages of the first power supply 40 and the inter-terminal voltage of the second power supply 50. Further, the controller 72 uses the inter-terminal voltage of the first power supply 40 to obtain the state of charge (charging rate) of the first power supply 40, and the controller 72 uses the inter-terminal voltage of the second power supply 50 to obtain the state of charge (charging rate) of the second power supply 50. Additionally, the controller 72 obtains an open voltage (inter-terminal voltage of second power supply 50 with no load: open circuit voltage) of the second power supply 50 from the inter-terminal voltage of the second power supply 50. In this manner, the controller 72 determines whether or not the second power supply 50 is fully charged.

Figure 2A:
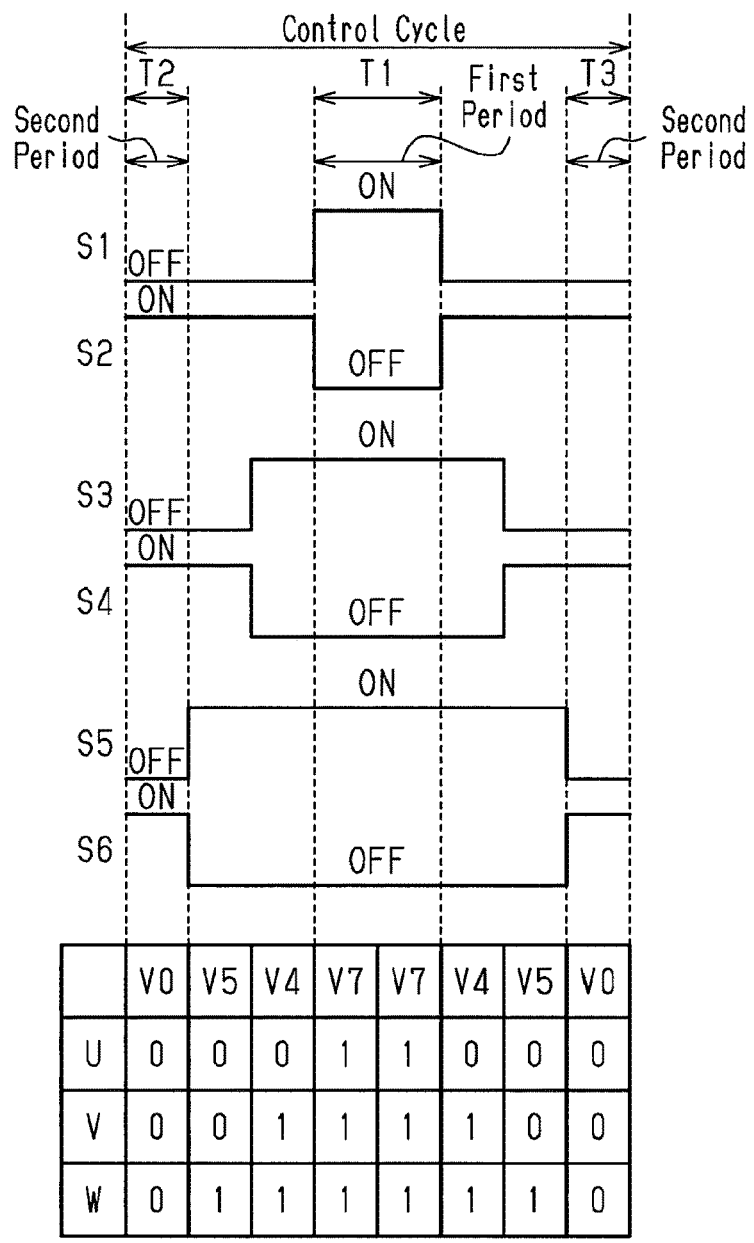
FIG. 2A is a diagram showing a switching pattern (wave formation pattern) under space vector PWM control in a dual drive mode.
Figure 2B:
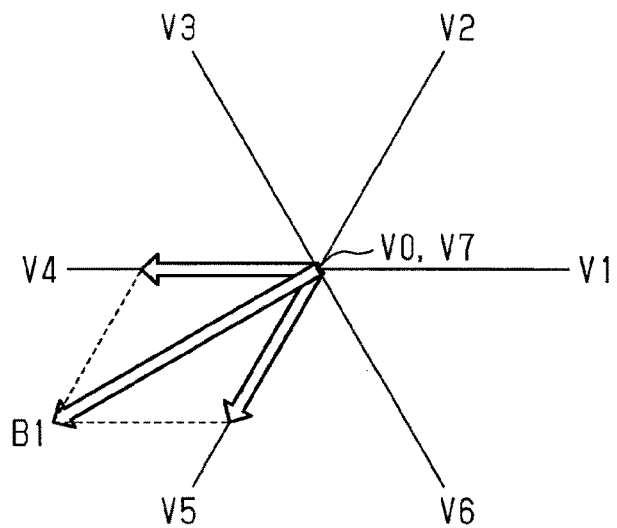
FIG. 2B is a vector diagram of the dual drive mode.
Figure 3A:
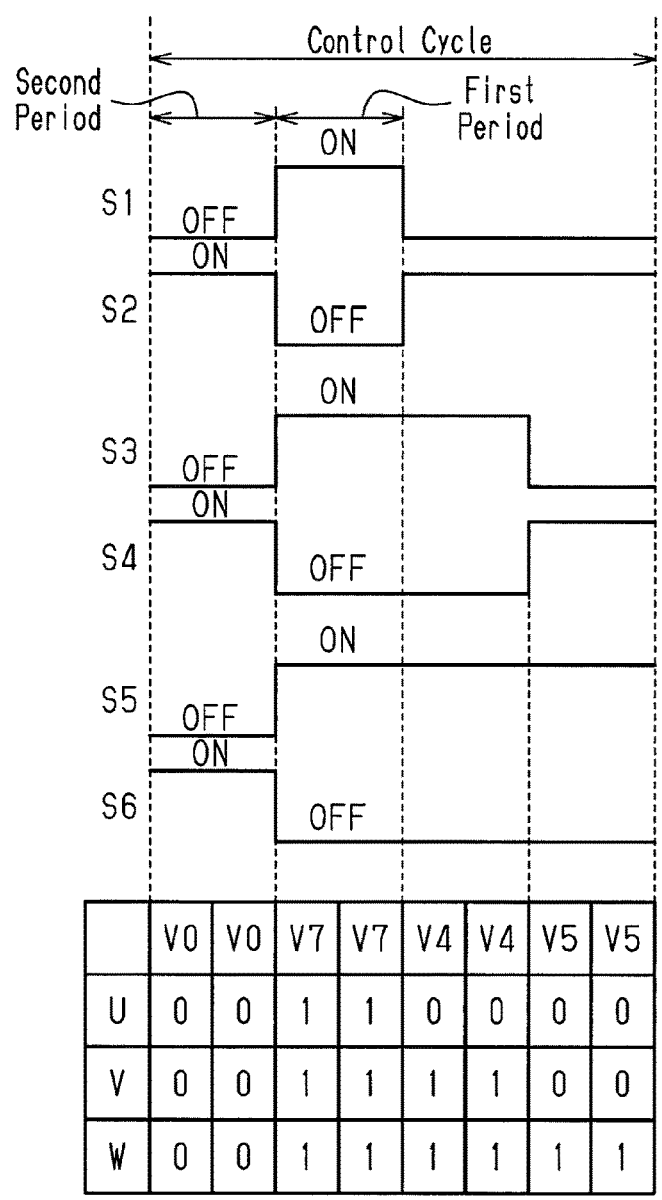
FIG. 3A is a diagram showing a switching pattern (wave formation pattern) of the space vector PWM control in the dual drive mode.
Figure 3B:
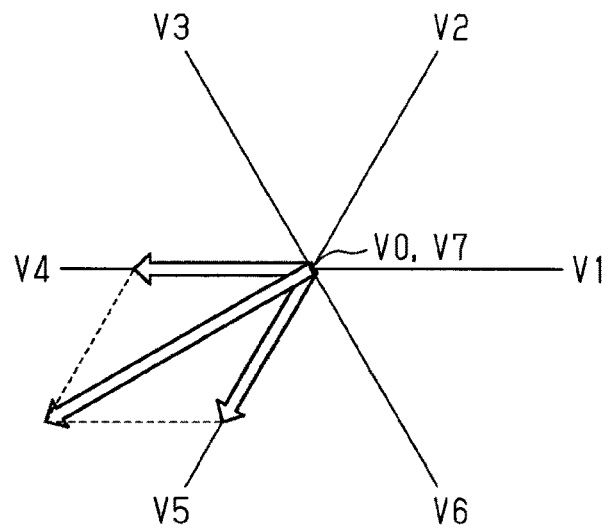
FIG. 3B is a vector diagram of the dual drive mode.
Figure 4A:
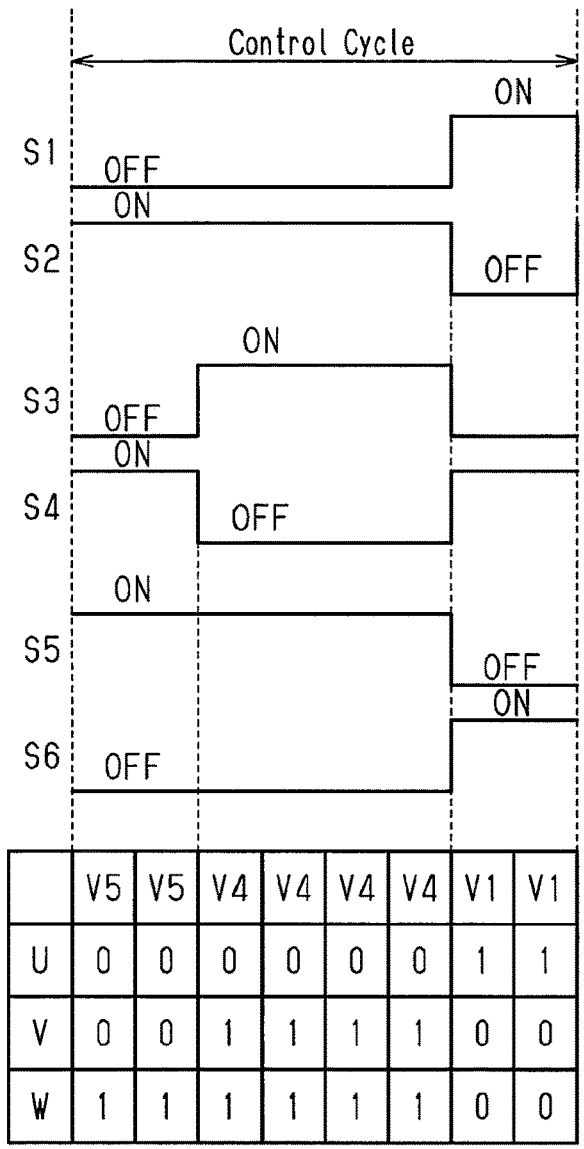
FIG. 4A is a diagram showing a switching pattern (wave formation pattern) of the space vector PWM control in a motor drive mode.
Figure 4B:
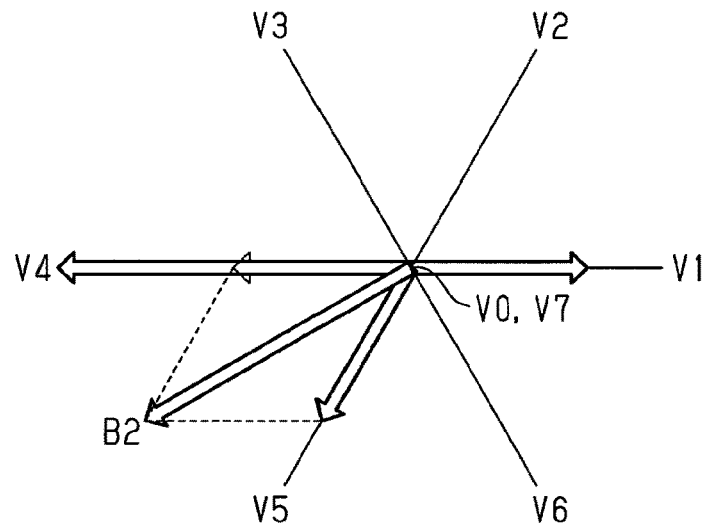
FIG. 4B is a vector diagram of the motor drive mode.
Figure 5A:
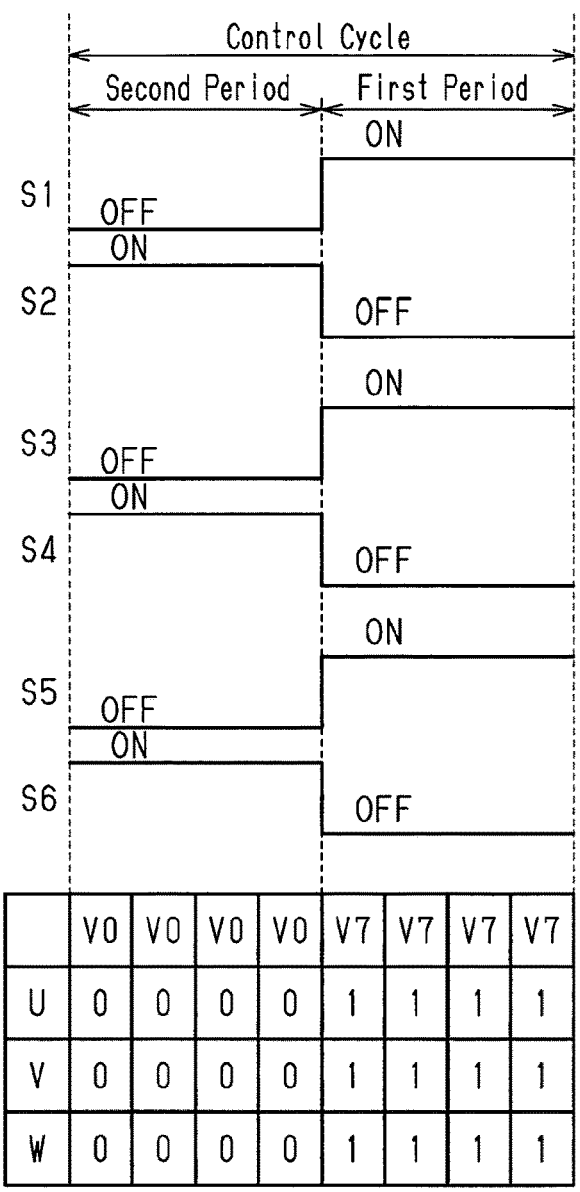
FIG. 5A is a diagram showing a switching pattern (wave formation pattern) of the space vector PWM control in a transformation drive mode.
Figure 5B:
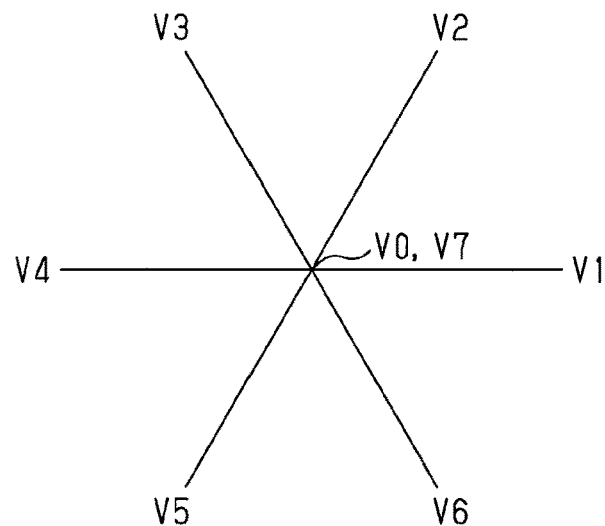
FIG. 5B is a vector diagram of the transformation drive mode.

The control unit 70 is configured to set a dual drive mode, which is shown in FIGS. 2A and 2B and FIGS. 3A and 3B, a motor drive mode, which is shown in FIGS. 4A and 4B, and a transformation drive mode (step-up and step-down drive mode), which is shown in FIGS. 5A and 5B.

As shown in FIGS. 2A and 2B and FIGS. 3A and 3B, in the dual drive mode, the control unit 70 has the motor 30 output a target torque and controls the switching element pairs (S1 and S2, S3 and S4, and S5 and S6) of the inverter circuit 20 in each control cycle either by stepping up (transforming) the voltage of the second power supply 50 to charge the first power supply 40 or by stepping down (transforming) the voltage of the first power supply 40 to charge the second power supply 50. Further, the control unit 70 is configured to adjust a ratio between a first period during which the upper arm switching elements S1, S3, and S5 are all turned on and the lower arm switching elements S2, S4, and S6 are all turned off and a second period during which the upper arm switching elements S1, S3, and S5 are all turned off and the lower arm switching elements S2, S4, and S6 are all turned on to adjust a step-up ratio (transformation ratio) of the second power supply 50 to the first power supply 40 or a step-down ratio (transformation ratio) of the first power supply 40 to the second power supply 50. In the dual drive mode, the control unit 70 includes the first period and the second period in the same control cycle when the motor 30 is being driven to perform motor driving and transformation driving (step-up and step-down driving). More specifically, the controller 72 monitors the state of charge of the first power supply 40 and the state of charge of the second power supply 50. In accordance with the state of charge, the controller 72 charges one of the power supplies with the other one of the power supplies. In other words, when the charging rate of the first power supply 40 is low, the controller 72 steps up the voltage of the second power supply 50 to charge the first power supply 40. Further, when the charging rate of the second power supply 50 is low, the controller 72 steps down the voltage of the first power supply 40 to charge the second power supply 50.

As shown in FIGS. 4A and 4B, in the motor drive mode, the control unit 70 does not include the first period and the second period in the same control cycle when the motor 30 is being driven so as to perform only motor driving.

As shown in FIGS. 5A and 5B, in the transformation drive mode (step-up and step-down drive mode), the control unit 70 includes the first period and the second period in the same control cycle and does not drive the motor 30.

The control unit 70 is configured to switch to the dual drive mode, the motor drive mode, or the transformation drive mode in each control cycle. That is, the control unit 70 is configured to select one of a plurality of the drive modes in each control cycle. Further, the control unit 70 executes a process illustrated in FIG. 6 to switch to the dual drive mode, the motor drive mode, or the transformation drive mode (step-up and step-down drive mode) in accordance with the situation of the second power supply 50 and the motor 30.

In FIGS. 2A, 3A, 4A, and 5A, the timing when the upper arm switching elements S1, S3, and S5 fall from on to off and the timing when the lower arm switching elements S2, S4, and S6 rise from off to on may be provided with a delay so as not to be synchronized. In the same manner, the timing when the upper arm switching elements S1, S3, and S5 rise from off to on and the timing when the lower arm switching elements S2, S4, and S6 fall from on to off may be provided with a delay so as not to be synchronize.

The dual drive mode, the motor drive mode, and the transformation drive mode will now be described in detail.

The low voltage second power supply 50 is connected to the neutral point A of the motor 30. Further, the coils 31, 32, 33 of the motor 30 are used as a step-up and step-down inductor to obtain a transformer circuit (step-up and step-down circuit). This allows for the implementation of a control method (switching method) for performing voltage step-up and step-down when the motor is being driven.

As shown in FIG. 1, the positive electrode of the low voltage second power supply 50 is connected to the neutral point A of the motor 30. The low voltage second power supply 50 and the high voltage first power supply 40 share negative electrodes. When actuating the inverter in a regular manner, the first period simultaneously turns on the upper arm switching elements S1, S3, and S5, and the second period simultaneously turns off the lower arm switching elements S2, S4, and S6. During the first period and the second period, torque is not generated with the motor 30. Further, the transformation ratio (step-up ratio, step-down ratio) is D/(D−1). Here, D represents the duty ratio of the on time of a zero voltage vector V0 to the on time of a zero voltage vector V7. More specifically, as shown in FIG. 2A, the transformation ratio is equal to {T1/(T1+T2+T3)}/{T1/(T1+T2+T3)−1} where T1 represents the on period of the zero voltage vector V7, T2 represents a former on period of the zero voltage vector V0, and T3 represents a latter on period of the zero voltage vector V0.

The inverter adjusts the duty ratio of the upper switching elements S1, S3, and S5 and the lower switching elements S2, S4 and S6 to perform voltage step-up and step-down (transformation). More specifically, the inverter adjusts the ratio of the first period and the second period to adjust the step-up ratio of the second power supply 50 to the first power supply 40 or the step-down ratio of the first power supply 40 to the second power supply 50 so as to perform voltage step-up and step-down driving. Thus, the inverter circuit 20 does not require switches and inductors for voltage step-up and step-down, and the system is reduced in size and cost.

Under the regular control (dual drive mode), as shown in FIGS. 2A and 2B, the zero voltage vector V0 and the zero voltage vector V7 function to step up and step down the voltage. Further, the voltage vectors V4 and V5 are applied to the motor 30 as voltage for motor driving. In this case, the resultant vector B1, which is the total of the voltage vectors V4 and V5, is applied to the motor 30.

As shown in FIGS. 2B and 3B, the output voltage obtained from the switching shown in FIG. 2A is the same as the output voltage obtained from the switching shown in FIG. 3A. Further, the step-up and step-down effect obtained from the switching shown in FIG. 2A is the same as the step-up and step-down effect obtained from the switching shown in FIG. 3A.

FIG. 4A shows an example of the PWM control in the motor drive mode when only the motor 30 is being driven. As shown in 4A, the on period of the switching elements are adjusted to eliminate the period during which the zero voltage vector V0 is generated and the period during which the zero voltage vector V7 is generated so that voltage step-up and step-down is not performed (no current flows at neutral point A) and only driving of the motor 30 is allowed. In this case, the resultant vector B1, which is the total of the voltage vectors V4 and V5 shown in FIG. 2B, is the same as the resultant vector B2, which is the total of the voltage vectors V4 and V5 shown in FIG. 4B. Further, the voltage resulting from the resultant vector B1 and applied to the motor 30 is the same as the voltage resulting from the resultant vector the B2 and applied to the motor 30.

This allows only the motor 30 to be driven (no current flows at neutral point A). Further, this allows the transformation drive mode, which only performs voltage step-up and step-down (transformation), to be performed. Thus, the three modes can selectively be performed.

As shown in FIGS. 5A and 5B, the transformation drive mode, which only performs voltage step-up and step-down, only requires the zero voltage vector V0 and the zero voltage vector V7 to be used. The transformation drive mode allows voltage step-up and step-down to be performed without generating torque with the motor 30.

In this way, the dual drive mode, the motor drive mode, and the transformation drive mode have different space vectors in each switching cycle and can be selectively used in accordance with the driving situation or the like.

The operation will now be described.

Figure 6:
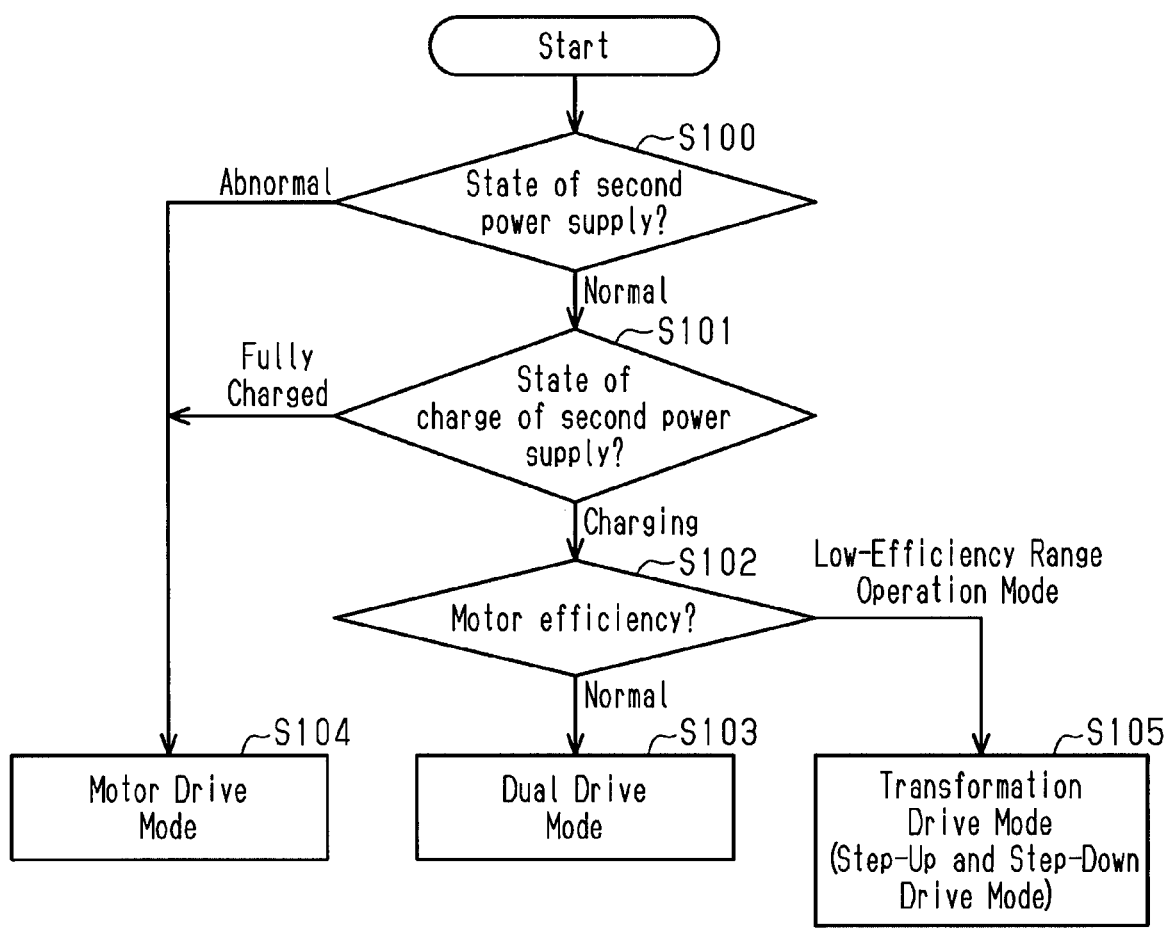
FIG. 6 is a flowchart illustrating the operation of the motor apparatus.

As shown in FIG. 6, in step S100, the controller 72 determines the state of the second power supply 50, that is, whether or not the second power supply 50 is operating normally (whether or not abnormality has occurred). Specifically, the controller 72 determines whether or not the inter-terminal voltage of the second power supply 50, which is obtained by the voltage sensor 81 during the application of voltage, is less than a predetermined threshold value. The controller 72 determines that the second power supply 50 is operating normally when the inter-terminal voltage of the second power supply 50 is greater than the predetermined threshold value. Further, the controller 72 determines that the second power supply 50 has an abnormality when the inter-terminal voltage of the second power supply 50 is less than the predetermined threshold value.

As shown in FIG. 6, in step S101, the controller 72 determines the state of charge of the second power supply 50, that is, whether the second power supply 50 is being charged or is fully charged. Specifically, the controller 72 determines whether the open voltage of the second power supply 50 is greater than a predetermined full charge threshold value or less than the predetermined full charge threshold value. The controller 72 determines that the second power supply 50 is fully charged when the open voltage of the second power supply 50 is greater than the predetermined full charge threshold value. Further, the controller 72 determines that the second power supply 50 is being charged when the open voltage of the second power supply 50 is less than the predetermined full charge threshold value.

As shown in FIG. 6, in step S102, the controller 72 determines whether the motor 30 is operating with regular efficiency or in a drive mode of which efficiency is in a low range. Specifically, the controller 72 obtains the torque instruction value and the rotation speed instruction value and determines whether the efficiency of the motor 30 is in a normal range or a low-efficiency range with a three dimensional map (map indicating relationship of torque instruction value, rotation speed instruction value, and efficiency).

As shown in FIG. 6, when the second power supply 50 is operating normally, the second power supply 50 is being charged, and the motor 30 is operating with normal efficiency, the controller 72 sets the dual drive mode in step S103. Further, when the second power supply 50 has an abnormality or the second power supply 50 is fully charged, the controller 72 sets the motor drive mode at step S104. Additionally, when the second power supply 50 is operating normally, the second power supply 50 is being charged, and the motor 30 is operating in a drive mode of which the efficiency is in a low range, the controller 72 sets the transformation drive mode (step-up and step-down drive mode), which requires no torque, in step S105.

In this way, when the second power supply 50 has an abnormality or the second power supply 50 is in a fully charged state, the controller 72 sets the motor drive mode, which requires no current to flow to the second power supply 50. Further, when the motor 30 is operating in the low efficiency range, there is no need for torque current to flow to the motor 30. This allows the controller 72 to set the transformation drive mode (step-up and step-down drive mode), which only performs voltage step-up and step-down (transformation).

An abnormality is determined with the voltage sensor 81. Instead, the current flowing to the motor 30 may be detected to determine that the second power supply 50 has an abnormality when the current value is less than a threshold value.

The above embodiment has the advantages described below.

(1) The motor apparatus 10 includes the motor 30 and the inverter circuit 20. The motor 30 is driven by three-phase alternating current power that is multiphase alternating current power. The inverter circuit 20 is configured to supply the motor 30 with three-phase alternating current power that is multiphase alternating current power. The inverter circuit 20 includes the upper arm switching elements S1, S3, and S5 respectively connected in series to the lower arm switching elements S2, S4, and S6, to configure a plurality of (specifically, three) switching element pairs. Further, the motor apparatus 10 includes the first power supply 40, the second power supply 50, and the control unit 70. The first power supply 40 is connected to the positive bus bar Lp and the negative bus bar Ln of the inverter circuit 20. The second power supply 50 is connected to the negative bus bar Ln of the inverter circuit 20 and the neutral point A of the motor 30. The control unit 70 has the motor 30 output a target torque and controls the switching element pairs (S1 and S2, S3 and S4, and S5 and S6) of the inverter circuit 20 in each control cycle by stepping-up (transforming) the voltage of the second power supply 50 to charge the first power supply 40 and by stepping-down (transforming) the voltage of the first power supply 40 to charge the second power supply 50. The control unit 70 is configured to adjust the ratio of the first period during which the upper arm switching elements S1, S3, and S5 are all turned on and the lower arm switching elements S2, S4, and S6 are all turned off and the second period during which the upper arm switching elements S1, S3, and S5 are all turned off and the lower arm switching elements S2, S4, and S6 are all turned on to adjust the step-up ratio (transformation ratio) of the second power supply 50 to the first power supply 40 or the step-down ratio (transformation ratio) of the first power supply 40 to the second power supply 50. Further, the control unit 70 is configured to select one of a plurality of drive modes in each control cycle. The drive modes include the dual drive mode, which includes the first period and the second period in the same control cycle when the motor 30 is being driven to perform motor driving and transformation driving (step-up and step-down driving), and the motor drive mode, which does not include the first period and the second period in the same control cycle when the motor 30 is being driven to perform only motor driving. In this way, in the dual drive mode, motor driving and transformation driving are performed. Further, in the motor drive mode, the switches do not have to be opened and only motor driving is performed. This allows the motor apparatus 10 to easily perform motor driving together with transformation driving (step-up and step-down driving), which is performed between the two batteries, or perform only motor driving.

(2) The drive modes further include the transformation drive mode (step-up and step-down drive mode) that does not drive the motor 30 and includes the first period and the second period in the same control cycle. The control unit 70 is configured to select one of the drive modes in each control cycle in accordance with the situation of the second power supply 50 and the motor 30. Thus, the motor apparatus 10, in accordance with the situation of the second power supply 50 and the motor 30, easily performs motor driving and transformation driving, which is performed between the two batteries, only motor driving, or only transformation driving (step-up and step-down driving).

(3) The situation of the second power supply 50 includes a situation of whether or not the second power supply 50 has an abnormality. This allows only motor driving to be performed when the second power supply 50 has an abnormality.

(4) The first power supply 40 is a high voltage battery having a higher voltage than the second power supply 50 and is thus practical.

The embodiment described above is not limited to the foregoing description. For example, the present invention may be embodied in the following forms.

The control unit 70 selects one of the drive modes in accordance with the situation of the second power supply 50. Instead, the control unit 70 may also select one of the drive modes in accordance with the situation of the first power supply 40.

The number of phases of the motor 30 may be a number other than three.

The first power supply 40 and the second power supply 50 may have any power voltage within a range including 12V, 24V, or 48V as long as the negative electrode of the first power supply 40 and the negative electrode of the second power supply 50 are common.

The second power supply 50 has a lower voltage than the first power supply 40. Instead, the second power supply 50 may have a higher voltage than the first power supply 40.

The first power supply 40 and the second power supply 50 may be rechargeable batteries, capacitors, or the like.

The switching elements S1 to S6 are not limited to IGBTs and may be, for example, power MOSFETs.

The invention claimed is:

1. A motor apparatus comprising:
a motor configured to be driven by multiphase alternating current power;

an inverter circuit including a positive bus bar and a negative bus bar and configured to supply multiphase alternating current power to the motor, wherein the inverter circuit includes upper arm switching elements that are respectively connected in series to lower arm switching elements to configure a plurality of switching element pairs;

a first power supply connected to the positive bus bar and the negative bus bar;

a second power supply connected to the negative bus bar and a neutral point of the motor;

a control unit configured to have the motor output a target torque and control the switching element pairs of the inverter circuit in each control cycle to transform a voltage of the second power supply in order to charge the first power supply or to transform a voltage of the first power supply in order to charge the second power supply, wherein the control unit is configured to adjust a ratio of a first period during which the upper arm switching elements are all turned on and the lower arm switching elements are all turned off and a second period during which the upper arm switching elements are all turned off and the lower arm switching elements are all turned on to adjust a transformation ratio of the second power supply to the first power supply or a transformation ratio of the first power supply to the second power supply, the control unit is configured to select one of a plurality of drive modes in each control cycle, and the drive modes include a dual drive mode, which includes the first period and the second period in one of the control cycles when the motor is being driven to perform motor driving and transformation driving, and a motor drive mode, which does not include the first period and the second period in one of the control cycle when the motor is being driven to perform only motor driving.

2. The motor apparatus according to claim 1, wherein:

the drive modes further includes a transformation drive mode, which does not drive the motor and includes the first period and the second period in one of the control cycles; and the control unit is configured to select one of the drive modes in each control cycle in accordance with a situation of the first power supply or the second power supply and a situation of the motor.

3. The motor apparatus according to claim 2, wherein the situation of the first power supply or the second power supply includes a situation of whether or not the first power supply or the second power supply has an abnormality.

4. The motor apparatus according to claim 1, wherein the first power supply is a high voltage battery having a higher voltage than the second power supply.

* * * * *